(12) United States Patent
Grede et al.

(10) Patent No.: US 10,530,304 B2
(45) Date of Patent: Jan. 7, 2020

(54) SYSTEM AND METHOD FOR ADJUSTING OUTPUT OF AMPLIFIERS

(71) Applicant: TRUMPF Huettinger GmbH + Co. KG, Freiburg (DE)

(72) Inventors: Andre Grede, Freiburg (DE); Daniel Gruner, Muellheim (DE); Christian Bock, Freiburg (DE); Alberto Pena Vidal, Freiburg (DE); Manuel vor dem Brocke, Freiburg (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/854,282

(22) Filed: Dec. 26, 2017

(65) Prior Publication Data

US 2018/0138864 A1 May 17, 2018

Related U.S. Application Data

(63) Continuation of application No. PCT/EP2016/065387, filed on Jun. 30, 2016.

(30) Foreign Application Priority Data

Jun. 30, 2015 (DE) .................. 10 2015 212 149

(51) Int. Cl.
*H03F 1/02* (2006.01)
*H01J 37/32* (2006.01)
(Continued)

(52) U.S. Cl.
CPC ...... *H03F 1/0233* (2013.01); *H01J 37/32174* (2013.01); *H03F 3/193* (2013.01); *H03F 3/20* (2013.01); *H03F 3/345* (2013.01)

(58) Field of Classification Search
CPC ........ H03F 1/0233; H03F 3/345; H03F 3/193; H03F 3/20; H01J 37/32174
See application file for complete search history.

(56) References Cited

U.S. PATENT DOCUMENTS

| 6,166,598 A | 12/2000 | Schlueter |
| 7,872,523 B2 | 1/2011 | Sivakumar |

(Continued)

FOREIGN PATENT DOCUMENTS

| DE | 102013226511 | 6/2015 |
| EP | 2410655 | 1/2012 |

(Continued)

OTHER PUBLICATIONS

Draxler et al., "High Efficiency Envelope Tracking LDMOS Power Amplifier for W-CDMA," IEEE, 2006, 1534-1537.

(Continued)

*Primary Examiner* — Emily P Pham
(74) *Attorney, Agent, or Firm* — Fish & Richardson P.C.

(57) ABSTRACT

A power supply system comprises an amplifier stage that includes at least one transistor, for example an LDMOS transistor. The transistor is connected to a supply voltage via a power connection, and is controlled by a control voltage at the control connection of the transistor. In some implementations, a first controller is provided for adjusting the control voltage of the transistor, and a second controller is provided for adjusting the supply voltage. In some implementations, one of the controllers is designed to feed a state signal to the other controller, and the other controller is designed to evaluate the state signal.

23 Claims, 2 Drawing Sheets

(51) Int. Cl.
*H03F 3/193* (2006.01)
*H03F 3/20* (2006.01)
*H03F 3/345* (2006.01)

(56) References Cited

U.S. PATENT DOCUMENTS

| | | | |
|---|---|---|---|
| 8,095,090 B2 | 1/2012 | Drogi et al. | |
| 8,344,801 B2 | 1/2013 | Owen et al. | |
| 8,536,941 B2 | 9/2013 | Hongo et al. | |
| 8,779,662 B2 | 7/2014 | Boston | |
| 9,041,464 B2 | 5/2015 | Komninakis et al. | |
| 2002/0050845 A1* | 5/2002 | Popescu | H03F 1/22 327/108 |
| 2007/0145900 A1 | 6/2007 | Kirchmeier et al. | |
| 2008/0284510 A1 | 11/2008 | Drogi et al. | |
| 2009/0004981 A1 | 1/2009 | Eliezer et al. | |
| 2010/0311365 A1 | 12/2010 | Gravesen et al. | |
| 2013/0222062 A1 | 8/2013 | Park et al. | |
| 2013/0231069 A1 | 9/2013 | Drogi et al. | |
| 2014/0084700 A1 | 3/2014 | Anderson et al. | |
| 2014/0213196 A1 | 7/2014 | Langer et al. | |
| 2014/0312974 A1 | 10/2014 | Khesbak et al. | |
| 2016/0195883 A1* | 7/2016 | Aboudina | G05F 1/575 323/280 |
| 2016/0252924 A1* | 9/2016 | Masoumi | H03K 17/165 323/313 |
| 2016/0277045 A1* | 9/2016 | Langer | H04B 1/0475 |
| 2016/0299548 A1 | 10/2016 | Grede et al. | |

FOREIGN PATENT DOCUMENTS

| | | |
|---|---|---|
| WO | WO 2012/023624 | 2/2012 |
| WO | WO 2017/001604 | 1/2017 |

OTHER PUBLICATIONS

International Search Report and Written Opinion in International Application No. PCT/EP2016/065387, dated Oct. 19, 2016, 20 pages (with English translation).
Third Party Observation for Application No. EP 20160739432 dated Jul. 18, 2019.

* cited by examiner

SYSTEM AND METHOD FOR ADJUSTING OUTPUT OF AMPLIFIERS

CROSS REFERENCE TO RELATED APPLICATIONS

This application is a continuation of and claims priority under 35 U.S.C. § 120 from PCT Application No. PCT/EP2016/065387 filed on Jun. 30, 2016, which claims priority from German Application No. DE 10 2015 212 149.6, filed on Jun. 30, 2015. The entire contents of each of these priority applications are incorporated herein by reference.

TECHNICAL FIELD

The invention relates to a power supply system including an amplifier stage, and a method for adjusting an output variable of the amplifier stage of a power supply system.

BACKGROUND

Power supply systems, in particular systems that generate power at frequencies of ≥1 MHz, are used for example for laser excitation, in plasma coating installations, or for induction applications. Power supply systems of this kind include amplifiers that generate the power that is supplied to the plasma coating installations, in induction applications or in laser excitation. There are, in principle, two concepts for controlling the power of an amplifier. In amplitude control, the output power of the amplifier is controlled by the amplitude of the input signal. Alternatively, the output power of the amplifier can be controlled by controlling the supply voltage of the amplifier. In this type of control, efficiency is kept relatively constant over a wide dynamic range. The amplifiers generally include at least one transistor which is connected to the supply voltage. Since the supply voltage is controlled, combinations of the driving voltage of the transistors and the supply voltage may arise, which subject the transistor to thermal stresses. In particular, the transistor is at risk of getting damaged in the process or having its service life significantly reduced.

SUMMARY

One object of the present invention is to make it possible to prevent such thermal stresses on the transistor in order to thereby minimize occurrences of failure and service life shortening.

This object is achieved by a power supply system including an amplifier stage that has at least one transistor, for example a Laterally Diffused Metal Oxide Semiconductor (LDMOS) transistor; the transistor is connected to a supply voltage by a power terminal and has a driving terminal driven by a driving voltage; a first controller for adjusting the driving voltage of the transistor and a second controller for adjusting the supply voltage are provided.

In some implementations, one of the controllers can be configured to feed a state signal to the other controller. The other controller can be configured to evaluate the state signal. In some implementations, the other controller can be configured to react to the state signal.

This feeding and evaluation of the state signal makes it possible to operate the amplifier stage in well-controlled operating points or ranges, and ensure that the amplifier stage functions in a safe manner. Further, situations in which the transistor of the amplifier stage is subject to too much thermal stress can be avoided.

In some implementations, both an actuating value of the first controller and a state signal of the first controller can be applied at the input of the second controller. The state signal of the first controller indicates whether the first controller is at its limit. The state signal can be distinguished from other signals in that it indicates that the controller that generates the state signal is in the control limit state.

In some implementations, a power control of the power supply system is divided into two channels, namely the first controller and the second controller.

In some implementations, a measuring device is provided for detecting an output variable of the amplifier stage as a control variable. The measuring device can be used to detect the output variable generated by the amplifier stage. The output variable can be compared with a set point in order to obtain an input variable for a controller, for example, the first controller. For this purpose, a control deviation determiner is provided, according to some implementations. The control deviation determiner determines a control deviation of the control variable from a set point. In some instances, the control deviation determiner is connected to the first controller. In this way, an error can be determined and fed to the first controller. In this instance, the first controller can thus perform as a closed-loop control in a control loop.

In some implementations, the output of the first controller can be connected to an input of the second controller. Thus, the second controller can adjust an actuating variable for the supply voltage or the supply voltage itself, based on a variable that has been adjusted by the first controller. The supply voltage is therefore adjusted according to the output variable of the first controller.

In some implementations, the output of the second controller can be connected to an input of the first controller. In this case, the first controller can also adjust its output variable based on the output variable of the second controller.

In some implementations, the second controller can be connected to the control deviation determiner. In some examples, the control deviation can be fed to the two controllers and each of the two controllers can be supplied with the output signal from the other controller respectively. This results in very complex control. Accordingly, the two controllers perform control on the basis of the output variable measured at the output of the amplifier stage and mutually limit each other's operating ranges or adjustment range.

In some implementations, one of the controllers can be configured to perform control, for example, closed-loop control, and the other controller can be configured to perform open-loop control. For example, the first controller can perform the closed-loop control and the second controller can, for example, perform the open-loop control.

In some implementations, one of the controllers can be configured to feed a state signal to the other controller, and the other controller can be configured to evaluate the state signal, and to react thereto. The state signal indicates that the controller that generates the state signal is in the control limit state. The controller that is designed to evaluate the state signal can be designed to switch from closed-loop control to open-loop control, or vice versa, when a state that indicates a controller is at a control limit, is detected. For example, a detected state can be a state that indicates the controller that provided the state signal is at a control limit (for example, a controlling threshold state). As another example, a state can be the state of "the controller that provided the state signal is at control limit". For example, the first controller can be configured to feed the state signal to the second controller, and the second controller can be configured to evaluate the state signal. In some implementations, the second controller can be configured, such that when the first controller indicates that it is at its limit, the second controller operates as a closed-loop controller. For example, the second controller can use the set point deviation as an input variable, when the set point deviation is also an input of the first controller. In some implementations, the second controller can be configured, such that when the first controller is performing control in the normal manner, i.e. is not at its limit, the second controller operates as an open-loop controller (open-loop mode) by following a predetermined characteristic curve.

The instant specification also describes a method for adjusting an output variable of the amplifier stage of a power supply system, in which the driving voltage of a transistor of the amplifier stage is adjusted by taking into account a set point and/or an output variable generated by the amplifier stage, and the supply voltage of the transistor is adjusted by taking into account the adjustment of the driving voltage. In some implementations, two actuating variables are fed to the amplifier stage or the transistor of the amplifier stage, which allow the amplifier or the transistor to be operated at two degrees of freedom. This makes it possible to avoid unsafe situations, for example, situations that lead to the transistor overheating. For example, this makes it possible for not all of the operating ranges of the two actuating variables (driving voltage and supply voltage) to be freely combined with one another. As a result, situations can be avoided in which the transistor of the amplifier stage is destroyed, because too much heat is produced during operation at low efficiency.

The driving voltage can also be adjusted by taking into account the adjustment of the supply voltage. This also makes it possible to limit the range in which the transistor of the amplifier stage, for example an LDMOS transistor, is operated.

The driving voltage can be adjusted by taking into account a set point and/or an output variable generated by the amplifier stage. These features can ensure in an even more reliable manner that no operating points occur which lead to the transistor being destroyed.

Further features and advantages of the invention can be found in the following description of an embodiment of the invention, with reference to the drawings, and in the claims. The individual features may each be implemented in isolation or together in any desired combination in a variant of the invention.

DESCRIPTION OF DRAWINGS

An embodiment of the invention is shown schematically in the drawings and is described in detail in the following with reference to the drawings, in which.

DETAILED DESCRIPTION

Figure 1:
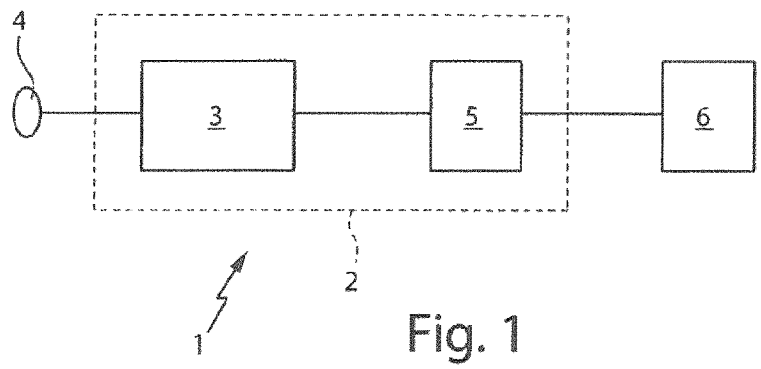
FIG. 1 is a highly schematic drawing of a plasma system comprising a power supply system, according to an implementation.

FIG. 1 shows a plasma system 1, which includes a power supply system 2. The power supply system 2 in turn includes a power converter 3, which can be connected to a voltage supply network 4. The power generated at the output of the power converter 3 is passed via an impedance matching network 5 to a plasma chamber 6. The plasma chamber 6 provides a plasma that can be used for plasma machining in the plasma chamber 6, for example, to etch a workpiece, or deposit a material layer on a substrate.

Figure 2:
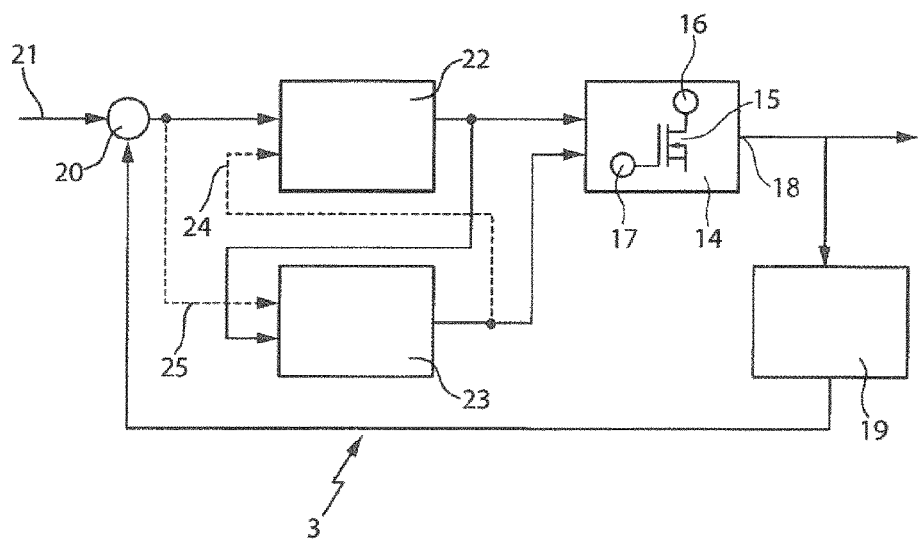
FIG. 2 is a block diagram illustrating control of transistors of an amplifier, according to implementation.

FIG. 2 shows part of the power supply system 3 from FIG. 1. In some implementations, the power supply system 3 includes an amplifier stage 14, which includes at least one transistor 15. The transistor 15 is connected to a supply voltage by means of a power terminal 16. The transistor is connected to a driving voltage, for example a gate voltage or base voltage, by means of a driving terminal 17. At the output 18 thereof, the amplifier stage 14 generates an output signal, for example, a high-frequency power signal. A measuring device 19 is connected to the output 18 to measure the output signal. The signal measured in this way is routed to a control deviation determination means 20, at which a set point for the output variable at the output 18 is also specified. The control deviation determination means 20 determines a control deviation from the set point 21 and the control variable, which corresponds to the output variable of the measuring device 19. The control deviation is fed to a first controller 22. The first controller 22 determines a driving voltage for the transistor 15 or an actuating variable for the driving voltage of the transistor 15. The output of the first controller 22 is connected to an input of the second controller 23, which determines a supply voltage or an actuating variable for the supply voltage according to the variable determined by the first controller 22, and feeds said voltage or actuating variable to the amplifier stage 14.

The output of the second controller 23 can also optionally be connected to an input of the first controller 22. This is indicated by the dashed line 24. The control deviation can also be fed to the second controller 23, as indicated by the dashed line 25. In some implementations, the controller 22 operates in a closed control loop to perform closed-loop control. In some implementations, the second controller 23 is arranged in an open control loop to perform open-loop control. In some implementations, both the actuating value of the first controller 22 and a state signal that indicates whether the first controller 22 is at its limit, can be applied at the input of the second controller 23. In some implementations, the state signal is used to switch between open-loop control and closed-loop control in the second controller 23. For example, when the first controller 22 indicates that it is at its limit, the second controller 23 is used as a closed-loop controller and takes the set point deviation (which is also an input of the first controller 22) as an input variable. In some implementations, when the first controller 22 is performing control in the normal manner (i.e. is not at its limit), the second controller 23 only operates in the open-loop control mode by following a predetermined characteristic curve. The second controller 23 is therefore not always in the open-loop control mode.

Figure 3:
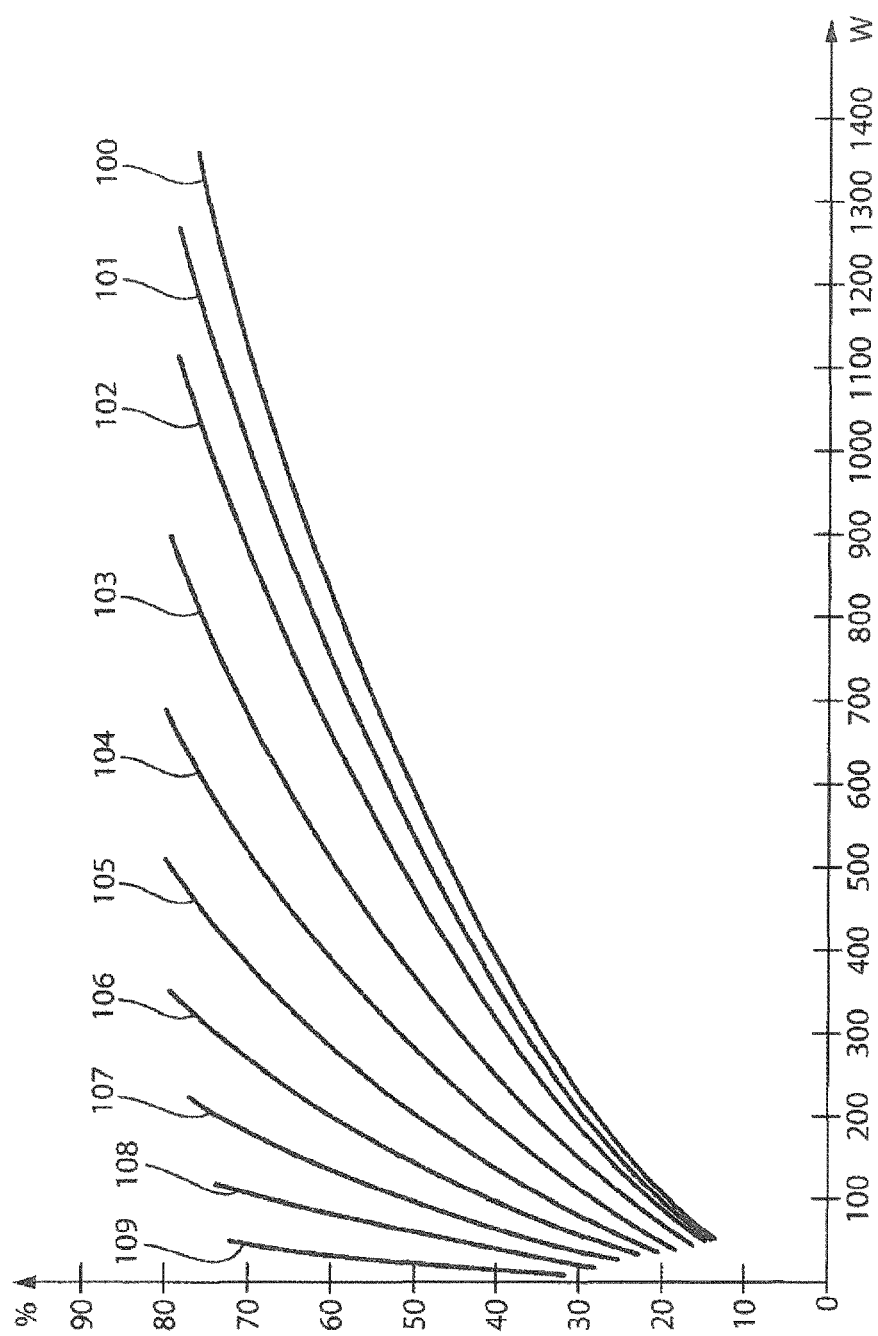
FIG. 3 is a diagram illustrating how the efficiency of an amplifier is dependent on the supply voltage, according to an example.

In FIG. 3, the efficiency of an amplifier stage 14 is plotted against the output power, at various supply voltages. Curve 100 was generated at a supply voltage of 50 V, curve 101 at a supply voltage of 48 V, curve 102 at a supply voltage of 45 V, curve 103 at a supply voltage of 40 V, curve 104 at a supply voltage of 35 V, curve 105 at a supply voltage of 30 V, curve 106 at a supply voltage of 25 V, curve 107 at a supply voltage of 20 V, curve 108 at a supply voltage of 15 V, and curve 109 at a supply voltage of 10 V. Referring to curve 100 as an example, at a supply voltage of 50 V an output power of approximately 50 W is achieved by the amplifier, which is a very low level of efficiency. In such a case, a very high amount of power is converted into heat in the transistor 15 of the amplifier stage 14, and this can lead to the transistor being destroyed. It is important to resolve states of this kind. Applying an arrangement according to the implementation shown in FIG. 2 improves the output power and the efficiency, as shown in FIG. 3.

What is claimed is:

1. A power supply system comprising:
   an amplifier stage comprising at least one transistor, the at least one transistor being connected to a supply voltage by a power terminal and having a driving terminal driven by a driving voltage;
   a first controller to adjust the driving voltage of the at least one transistor; and
   a second controller to adjust the supply voltage;
   wherein one of the first controller and the second controller is configured to provide a state signal to the other of the first controller and the second controller, which is configured to evaluate the state signal.

2. The power supply system of claim 1, wherein the other of the first controller and the second controller is configured to react to the state signal.

3. The power supply system of claim 1, wherein both an actuating value of the first controller and the state signal are applied at an input of the second controller, the state signal indicating whether the first controller is at a limit.

4. The power supply system of claim 1, wherein the state signal indicates that the one of the first controller and the second controller that provides the state signal is in a control limit state.

5. The power supply system of claim 1, wherein a power control of the power supply system is divided into two channels comprising the first controller and the second controller.

6. The power supply system of claim 1, further comprising a measuring device for detecting an output variable of the amplifier stage, the output variable being provided as a control variable.

7. The power supply system of claim 6, wherein the measuring device is configured to detect the output variable and to compare the output variable with a set point in order to obtain an input variable for one of the first and second controller.

8. The power supply system of claim 1, wherein the other of the first controller and the second controller that is configured to evaluate the state signal is configured to switch from one of a closed-loop control mode and an open-loop control mode to the other one of the closed-loop control mode and the open-loop control mode, when a state that indicates the controller that provided the state signal is at its control limit is detected.

9. The power supply system of claim 1, wherein the first controller is configured to provide the state signal to the second controller, and the second controller is configured to evaluate the state signal.

10. The power supply system of claim 1, wherein the second controller is configured to operate as a closed-loop controller when the first controller indicates that it is at a limit.

11. The power supply system of claim 10, wherein the second controller uses a set point deviation as an input variable, the set point deviation being obtained by comparing a set point and an output variable of the amplifier stage.

12. The power supply system of claim 1, wherein, when the first controller is performing control in a normal manner, the second controller operates as an open-loop controller by following a predetermined characteristic curve, wherein performing control in normal manner is different from performing at a control limit.

13. The power supply system of claim 6, further comprising a control deviation determiner that determines a control deviation of the control variable from a set point, the control deviation determiner being connected to the first controller.

14. The power supply system of claim 1, wherein an output of the first controller is connected to an input of the second controller.

15. The power supply system of claim 1, wherein an output of the second controller is connected to an input of the first controller.

16. The power supply system of claim 13, wherein the second controller is connected to the control deviation determiner.

17. The power supply system of claim 1, wherein the first controller and the second controller are each configured to perform one of closed-loop control, and open-loop control.

18. The power supply of claim 1, wherein the at least one transistor is an LDMOS transistor.

19. A method for adjusting an output variable of an amplifier stage of a power supply system, the method comprising:
    determining an output variable provided by the amplifier stage;
    adjusting, by a first controller, a driving voltage of a transistor of the amplifier stage based on at least one of a set point and the output variable; and
    adjusting, by a second controller, a supply voltage of the transistor based on adjustment of the driving voltage;
    wherein one of the first controller and the second controller provides a state signal to the other of the first controller and the second controller, which evaluates the state signal.

20. The method of claim 19, wherein the other of the first or the second controller reacts to the state signal.

21. The method of claim 19, wherein both an actuating value of the first controller and the state signal are applied at an input of the second controller, the state signal indicates whether the first controller is at a limit.

22. The method of claim 19, wherein the state signal indicates that one of the first controller and the second controller that provides the state signal is in a control limit state.

23. The method of claim 19, wherein the driving voltage is adjusted based on adjustment of the supply voltage.

* * * * *